United States Patent [19]

Crowther

[11] Patent Number: 4,797,108
[45] Date of Patent: Jan. 10, 1989

[54] METHOD OF MANUFACTURING AMORPHOUS SILICON FIELD EFFECT TRANSISTORS

[75] Inventor: Simon N. Crowther, Basingstoke, England

[73] Assignee: Lucas Industries Public Limited Company, Birmingham, England

[21] Appl. No.: 939,967

[22] Filed: Dec. 10, 1986

Related U.S. Application Data

[62] Division of Ser. No. 706,940, Mar. 1, 1985, abandoned.

[30] Foreign Application Priority Data

Mar. 10, 1984 [GB] United Kingdom ............... 8406330

[51] Int. Cl.⁴ .......................................... H01L 29/78
[52] U.S. Cl. .................................. 437/41; 437/101; 437/966; 357/23.7; 148/DIG. 1
[58] Field of Search ............... 29/571; 148/DIG. 1, 148/1.5; 357/23.7, 2, 4, 59 B, 58; 437/966, 101, 41

[56] References Cited

U.S. PATENT DOCUMENTS

| | | | |
|---|---|---|---|
| 4,065,781 | 12/1977 | Gutknecht | 357/23.7 |
| 4,398,340 | 8/1983 | Brown | 29/571 |
| 4,459,739 | 7/1984 | Shepherd et al. | 29/571 |
| 4,700,458 | 10/1987 | Suzuki et al. | 437/83 |

FOREIGN PATENT DOCUMENTS

| | | |
|---|---|---|
| 0071244 | 2/1983 | European Pat. Off. . |
| 0090661 | 5/1983 | European Pat. Off. . |
| 2902303 | 7/1979 | Fed. Rep. of Germany . |
| 189676A | 10/1984 | Japan . |
| 2118365 | 10/1983 | United Kingdom . |

OTHER PUBLICATIONS

"Amorphous Siliconl Enlarges LCDs", 8031 Electronics International, Vol. 55 (1982) May, No. 10, New York, U.S.A., pp. 94 and 96.
"Materials Limitations of Amorphous-Si:H Transistors", Dieter G. Ast, 9093 IEEE Transactions on Electron Devices, vol. ED-30 (1983), No. 5, New York, pp. 532-539.
Sze, *Physics of Semiconductor Devices*, New York: John Wiley and Sons, 1969.
Ghandhi, *VLSI Fabrication Principles*, New York: John Wiley and Sons, 1983.

*Primary Examiner*—Brian E. Hearn
*Assistant Examiner*—Mary Anne Wilczewski
*Attorney, Agent, or Firm*—Holman & Stern

[57] ABSTRACT

An a-Si FET comprising electrically conductive source and drain regions supported by an insulating substrate; a layer of amorphous silicon which is separately deposited in a space between said source and drain regions so as to engage the source and drain regions; source and drain electrodes electrically connected with said source and drain regions respectively; a gate electrode disposed adjacent said layer of amorphous silicon; and an insulating layer separating the gate electrode from the amorphous silicon layer; the arrangement being such that, in the ON state of the FET, a direct current-path is established in the layer of amorphous silicon which is disposed in said space. A low cost, low-temperature substrate such as soda glass may be used and the a-Si FET may be of the thin film type. Such an a-Si FET can be used in an LCD device which is addressed using one or more of the FET's.

4 Claims, 1 Drawing Sheet

METHOD OF MANUFACTURING AMORPHOUS SILICON FIELD EFFECT TRANSISTORS

The present invention relates to an amorphous silicon field effect transistor, in particular, thin film transistors, a method of production of the same and the use of such a device in a liquid crystal display.

The use of amorphous silicon in the production of field effect transistors is known and desirable both for reasons of cheapness and ease of production, amorphous silicon having similar but inferior electrical characteristics to crystalline silicon. Amorphous silicon field effect transistors (a - Si FET's) of the previously proposed types suffer from two main problems, firstly a restricted "ON" current due to the thickness of the intrinsic a-Si channel and secondly the plasma glow discharge method of producing the a-Si channels results in non-uniform layer thicknesses which means that similar devices will have different electrical characteristics. A thin-film a-Si FET has been proposed in GB No. 2118365A. However, the method of production of this a-Si FET has the disadvantage of requiring expensive processing steps such as ion implantation and/or the use of high temperatures (above 950° C.) in processing which in turn requires the use of expensive substrates and a greater number of processing steps during production.

It is an object of the present invention to obviate or mitigate these problems and disadvantages and provide a thin film a-Si FET having good electrical characteristics which is economical to produce and is capable of being applied to an inexpensive, low temperature substrate.

In one aspect of the present invention there is provided an a-Si FET comprising electrically conductive source and drain regions supported by an insulating substrate; a layer of amorphous silicon which is separately deposited in a space between said source and drain regions so as to engage the source and drain regions; source and drain electrodes electrically connected with said source and drain regions respectively; a gate electrode disposed adjacent said layer of amorphous silicon; and an insulating layer separating the gate electrode from the amorphous silicon layer; the arrangement being such that, in the ON state of the FET, a direct current-path is established in the layer of amorphous silicon which is disposed in said space.

Preferably said source, drain and gate electrodes are mounted directly on the insulating substrate with said source and drain regions disposed on said electrodes respectively. Said insulating layer may be disposed on said gate electrode. Said layer of amorphous silicon may completely fill the space between said source and drain regions.

Alternatively, said source and drain regions may be mounted directly on the insulating substrate and the respective electrodes mounted on said regions.

Preferably, the substrate is soda-glass; the source, gate and drain electrodes are made of a metallic conductor such as aluminium or tin oxide; the insulating layer is made of silicon nitride; the source and drain are typically highly doped amorphous silicon using either n-type or p-type dopant, n-type being preferred.

A preferred method of forming the source and drain regions and the space therebetween is by depositing an electrically conductive layer and then removing, preferably by etching, part of said electrically conductive layer so as to define said space and said source and drain regions. The amorphous silicon layer can then be formed by deposition in said space.

Preferably, said electrically conductive layer is amorphous silicon. Conveniently, said amorphous silicon is doped during deposition. Preferably said doping is n-type.

The use of a-Si FET's in LCD devices has been proposed in J. Applied. Phys 24, pages 357–362 (1981) and also in GB No. 2118365A. However, these devices either have the problems associated with the previously proposed types of a-Si FET described above, or are expensive to produce due to the expensive processing required to produce a suitable thin-film a-Si FET as described in GB No. 2118365A.

In a further aspect of the present invention, there is provided a liquid crystal display (LCD) device addressed using one or more FETs according to said one aspect of the present invention. In a preferred embodiment, the FET is formed on one of the side plates of the LCD device, the drain electrode being connected to one of the pixel electrodes.

In the accompanying drawings

Figure 1A:
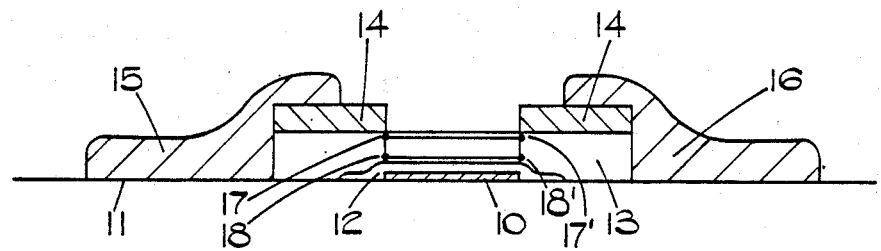
FIG. 1(a) is a conventional a-Si FET

Referring to FIG. 1(a), the structure of a conventional a-Si FET consists of a gate electrode 10 mounted on a substrate 11 and completely covered by an insulating layer 12. An intrinsic a-Si channel 13, is situated above the gate electrode 10 and is in contact with the insulating layer 12. On top of the intrinsic a-Si layer 13 are situated electrically conductive source and drain regions 14 and 14' made of highly doped silicon. These are in intimate contact with the intrinsic layer 13 and are situated so that the closest points in contact with the intrinsic layer 13 are in the region substantially above the gate electrode 10. A source electrode 15 and a drain electrode 16 are situated on the substrate and extend onto the regions 14 and 14' respectively so that there is a good electrical connection between the electrodes 15 and 16 and the regions 14 and 14'.

In operation, a potential difference is maintained between the source electrode 15 and the drain electrode 16 causing a current to flow between them, the current path 17 to 17' being the path of least resistance between the regions 14, 14'. This is the OFF state and only a small current flows as the resistance is high. When a positive voltage is applied to the gate electrode 10, a thin channel of electrons forms in a region 18 to 18' of the a-Si layer next to the gate electrode 10. Consequently, the resistance along 18 to 18' drops as the gate voltage increases until it is 4 or 5 orders of magnitude lower than it is in the OFF state. The path of least electrical resistance is 17 to 18, 18 to 18' and 18' to 17' and a current will flow which is greater than that in the OFF state. This is the ON state. The problem with this type of a-Si FET is that it is undesirable on two counts to have a thin a-Si channel region. Firstly, it is preferable to keep current paths in the ON state away from semiconductor surfaces, which has been achieved using thicker films. Secondly, the plasma glow discharge deposition process suffers from poor uniformity resulting in a variable a-Si layer thickness across the substrate. Thus it is difficult to control accurately the deposition of a thin a-Si layer. For these reasons, it has been preferred to have a channel thickness of 0.5–1.0 micrometer. However, the following problems arise. Firstly, the resistance of 17 to 18 and 18' to 17' can now make a significant contribution to the total device resistance due to the thicker film and so restrict the ON current. Secondly, because of the poor deposition uniformity of the a-Si layer, the lengths of 17 to 18 and 18' to 17' may have different values for various FET's of the same type, with the result that the current flow in the ON state varies from FET to FET of the same type.

Figure 1B:
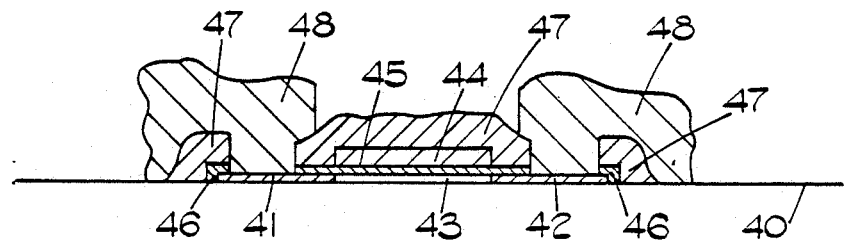
FIG. 1(b) is a diagrammatic representation of a previously proposed thin film a-Si FET.

The thin film FET shown in FIG. 1(b) is of a previously proposed type (see GB No. 2118365A) and comprises a substrate 40 having a layer of silicon defining a source region 41, a drain region 42 and an intervening channel 43. The source and drain regions 41 and 42 are formed by reducing the resistivity of the silicon in those particular regions by either ion implantation or diffusion of boron, phosphorous or arsenic. A gate electrode 44 is located over the intrinsic channel 43 and is separated therefrom by an insulating layer 45. A further insulating layer 46 is provided over part of the source 41 and drain 42. A final insulating layer 47 is provided in the location shown in FIG. 1(b), contact windows being provided in the region of the source and drain regions 41 and 42.

Aluminium electrodes 48 are provided which extend into the contact windows to contact the source and drain regions 41 and 42. This device design has the disadvantages of necessitating expensive processing (ion implantation) and/or the need to use high temperature in processing (950° C.) and so low cost substrates such as soda glass cannot readily be used. Also, a relatively larger number of processing steps are required to obtain the final structure.

Figure 2:
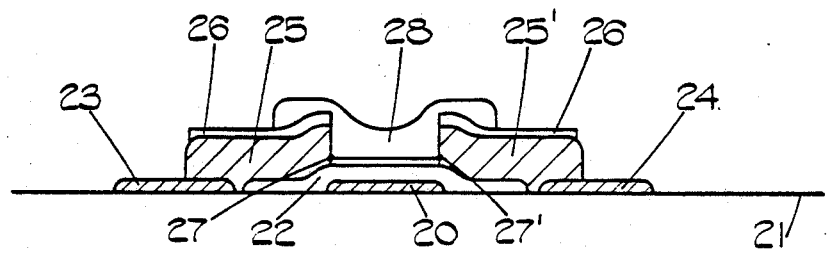
FIG. 2 is an a-Si FET of the preferred embodiment of the present invention

However, these problems can be overcome in an a-Si FET of the present invention. As shown in FIG. 2, a gate electrode 20 is provided on a substrate 21 and covered with an insulating layer 22. The source electrode 23 and drain electrode 24 are also provided on the substrate 21 and are separated from the gate electrode 20. Electrically conductive doped a-Si n+ or p+ source and drain regions 25 and 25', respectively, are spaced apart and are situated above the respective electrodes 23 and 24 so that they are in intimate electrical contact with the respective electrodes. The regions 25 and 25' extend into the region directly above the gate electrode 20 and are separated from it by the insulating layer 22. The regions 25 and 25' can have an optional insulating layer 26 The intervening space between the two regions 25 and 25' has separately deposited therein a-Si material 28 which extends over the upper part of the regions 25 and 25' and is in intimate contact with them at their closest points 27 and 27'.

The method of manufacture of the above described a-Si FET of the present invention includes the following procedure:

1. Deposit metal electrode material layer on said substrate.
2. Mask electrode pattern photolithographically.
3. Etch electrode pattern and de-mask.
4. Deposit gate insulating material layer.
5. Mask insulating pattern photolithographically.
6. Etch gate insulating pattern and de-mask.
7. Deposit a doped a-Si n+ or p+ layer which is destined to form the source and drain regions.
8. Mask source and drain region pattern photolithographically
9. Etch the source and drain region pattern and de-mask.
10. Deposit intrinsic a-Si layer
11. Mask a-Si layer pattern photolithographically.
12. Etch a-Si layer pattern and de-mask.

Typically the metal used in step 1 is aluminium deposited 1 micrometer thick using a sputtering process and the etch used in step 3 is 73 vol % phosphoric acid, 3.5 wt % acetic acid, 4 vol % nitric acid and 18.5 vol % deionized water. The photo resist is removed with a suitable organic solvent. The insulating layer in step 4 is preferably $Si_3N_4$ and is typically deposited in a reactor at a temperature of about 350° C., a pressure of about 2 mB (an RF field of about 13.56 MHz being used to set up a glow discharge), with 10 $cm^3$ $min^{-1}$ total gas flow using a mixture of 17.5% $SiH_4$ and 87.5% $NH_3$ at a deposition rate of 1–3 Angstroms/sec to give a layer thickness of 1000–3000 Angstroms.

The etching in step 6 is typically carried out in a barrel type plasma etcher using, for example $Si F_4$ gas with 1% $O_2$ at a pressure of about 1 mB with a gas flow rate of 20–100 $cm^3$/min at ambient temperature giving an etch rate of 1000 Angstroms/min.

The layer material of step 7 is preferably n-type a-Si typically deposited in a reactor at a temperature of about 300° C. and a pressure of about 0.7 mB (an RF field of 13.56 MHz being used to set up a glow discharge), using 10 $cm^3$ $min^{-1}$ total gas flow and a gas mixture of 99% $SiH_4$ + 1% $PH_3$ giving a deposition rate of 1–3 Angstroms/sec and the layer thickness is preferably 0.5–1.0 micrometer.

The insulating layer 26 may be deposited using the techniques described above for step 4 after step 7 to act as an end stop for the etch in step 12 although this is not imperative.

The etching process in step 9 is typically similar to that used in step 6 and results in the production of the source and drain regions which are spaced apart by a distance of about 10 micrometers.

The deposition of the intrinsic a-Si layer uses similar conditions to step 7 except that the gas used is preferably 100% $SiH_4$ and the layer thickness is preferred to be at least equal to the layer thicknesses of step 7.

The etching in step 12 is typically carried out in a barrel type plasma etcher using $CF_4$ gas with 1% $O_2$ with the other conditions typically the same as step 6. The material 28 also engages the layer 22 with this type of device, a direct current path exists between the regions 25 and 25' for both the ON and OFF states. In the ON state, the whole of the current path 27 to 27' is influenced by the gate voltage with no high resistance regions such as 17 to 18 and 18' to 17' in the convention a-Si FET. Channel thickness now has no effect as there are no vertical current paths such as 17 to 18 or 18' to 17' A thick a-Si layer may be deposited in order to keep the current path away from the semi-conductor surface without any of the adverse effects on the electrical performance of the device normally associated with the use of thick a-Si layers in devices of conventional construction. The photo-engraving process which defines the channel length 27 to 27' is more controllable than the deposition process which defines the channel thickness, and so reproducible channel lengths may be obtained resulting in FET's of a similar type having the same electrical characteristics. The length of the channel is about 10 micrometers whilst the width thereof is a few hundred micrometers.

Figure 3:
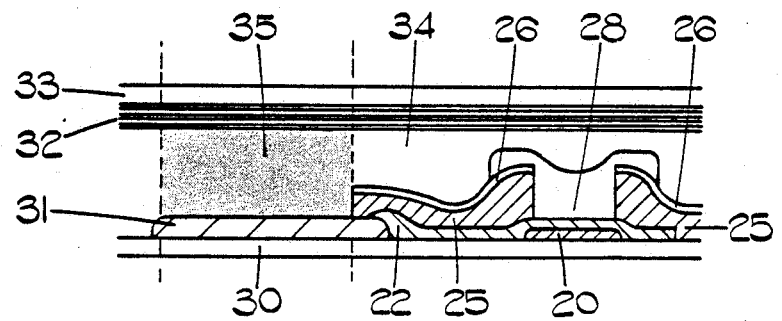
FIG. 3 is a cross section through an LCD device showing a single pixel with an associated a-Si FET of one embodiment of the present invention.

FIG. 3 shows a cross section through an LCD device showing a single pixel with an associated a-Si FET of the present invention. In this particular embodiment, the substrate for the FET is one of the glass side plates 30 of the LCD. The drain electrode 31 is one of the pixel electrodes, this and the other electrode 32 being made of transparent indium tin oxide. Another glass plate 33 forms the other side plate of the LCD, the intervening space being filled with liquid crystal material 34. It is the liquid crystal material 34 under the influence of the electrode 31 controlled by the FET of the present invention which affects the optical characteristics of the visible pixel region 35.

The scope of the present invention is not limited to the embodiment or method of production described above. In a modification, the source and drain electrodes are formed on the source and drain regions as the last step in production rather than being deposited on the substrate along with the gate electrode as hereinbefore described. In another modification, the gate electrode is formed on top of the intrinsic a-Si channel and is separated from it by an insulating layer. In this embodiment, the a-Si material does not completely fill the space between the source and drain regions in the completed FET. Both of these modifications may be present in an a-Si FET of a direct current-path between the source and drain regions and the length of the current path being defined by the distance between the source and drain regions with all of the attendant advantages as described above.

What is claimed is:

1. A method of manufacturing an amorphous silicon field effect transistor having component parts thereof formed on an insulating substrate, the component parts of said amorphous silicon field effect transistor including electrically conductive source and drain regions, a layer of intrinsic amorphous silicon provided in a space between said source and drain regions and in intimate electrical contact with said source and drain regions, source and drain electrodes in electrical connection with said source and drain regions respectively, a gate electrode adjacent said layer of intrinsic amorphous silicon, and a gate insulating layer separating said gate electrode from said layer of intrinsic amorphous silicon, said gate insulating layer contacting said source and drain regions, the method comprising the steps of:

forming source, drain and gate electrodes on an insulating substrate;

forming a gate insulating layer over said gate electrode;

forming a layer of electrically conductive doped amorphous silicon over said source and drain electrodes and over said gate insulating layer so as to be in direct contact therewith, said layer of electrically conductive doped amorphous silicon being destined to form said source and drain regions;

removing part of said layer of electrically conductive doped amorphous silicon to define therein respective source and drain regions which each contact the gate insulating layer and a respective one of said source and drain electrodes, and to define therein a space between said source and drain regions; and depositing a layer of intrinsic amorphous silicon in said space defined between said source and drain regions so as to bring said layer of intrinsic amorphous silicon into intiamte electrical contact with said source and drain regions and in contact with said gate insulating layer, points of contact of said layer of intrinsic amorphous silicon with said gate insulating layer corresponding to those points where said source and drain regions are closest to one another and in intimate electrical contact with said layer of intrinsic amorphous silicon.

2. The method according to claim 3, further comprising the steps of;

forming said source, drain and gate electrodes by depositing a layer of metal electrode material on said insulating substrate, masking an electrode pattern photolithographically on said layer of metal electrode material, etching the electrode pattern and de-masking said electrode pattern;

forming said gate insulating layer by depositing a layer of gate insulating material, masking a gate insulating pattern photolithographically, etching said gate insulating pattern and de-masking said gate insulating pattern;

forming said source and drain regions by depositing a layer of electrically conductive amorphous silicon destined to form said source and drain regions, masking a source and drain region pattern photolithographically on said layer of doped amorphous silicon, etching said source and drain region pattern and de-masking said source and drain region pattern; and forming said layer of intrinsic amorphous silicon by depositing intrinsic amorphous silicon in the space defined between said source and drain regions, masking an amorphous silicon layer pattern photolithographically on said intrinsic amorphous silicon, etching said amorphous silicon layer pattern and de-masking said amorphous silicon layer pattern.

3. The method according to claim 1, wherein said insulating substrate is one side plate of a liquid crystal display device, the method further comprising forming the drain electrode as an electrode of the liquid crystal display device.

4. The method according to claim 2, wherein the insulating substrate is one side plate of a liquid crystal display device, the method further comprising forming the drain electrode as an electrode of the liquid crystal display device.

* * * * *